United States Patent [19]

Drab et al.

[11] Patent Number: 5,638,252
[45] Date of Patent: Jun. 10, 1997

[54] ELECTRICAL DEVICE AND METHOD UTILIZING A POSITIVE-TEMPERATURE-COEFFICIENT FERROELECTRIC CAPACITOR

[75] Inventors: John Drab, Encinitas; O. Glenn Ramer, Los Angeles; David A. Robinson, Oceanside, all of Calif.

[73] Assignee: Hughes Aircraft Company, Los Angeles, Calif.

[21] Appl. No.: 490,432

[22] Filed: Jun. 14, 1995

[51] Int. Cl.⁶ .................................................. H01G 4/06
[52] U.S. Cl. .................. 361/321.1; 361/313; 361/311; 361/306.3; 257/295
[58] Field of Search ........................ 361/298.3, 311, 361/312, 301.1, 313, 321.1, 306.3, 321.2; 257/295, 296

[56] References Cited

U.S. PATENT DOCUMENTS 5,005,102  4/1991  Larson ....................................... 361/313
5,449,933  9/1995  Shindo et al. ............................ 257/295

*Primary Examiner*—Leo P. Picard
*Assistant Examiner*—Anthony Dinkins
*Attorney, Agent, or Firm*—W. C. Schubert; W. K. Denson-Low

[57] ABSTRACT

A capacitor (20) is fabricated using a ferroelectric material (28) such as a layered perovskite material of the Aurivillius family. The capacitor (20) has a positive temperature coefficient (PTC) of capacitance. When used in an electrical device other than a memory device in place of a conventional capacitor, the PCT capacitor (20) provides inherent temperature compensation of the signal of the device when the device is operated at different temperatures below the Curie temperature of the ferroelectric material.

14 Claims, 3 Drawing Sheets

5,638,252

ELECTRICAL DEVICE AND METHOD UTILIZING A POSITIVE-TEMPERATURE-COEFFICIENT FERROELECTRIC CAPACITOR

BACKGROUND OF THE INVENTION

This invention relates to electrical devices and their use, and, more particularly, to electrical devices which are self-compensated as to temperature.

Electrical devices contain two or more interconnected circuit elements. The performance of most circuit elements degrades with increasing temperature. Examples of this degradation include resistors, whose resistance generally decreases with increasing temperature; capacitors, whose capacitance decreases with increasing temperature; and silicon transistors, whose gain decreases with increasing temperature.

There are well established examples of the undesirable effects of temperature on circuit performance. Once example is amplifiers, which lose bandwidth as the temperature is increased. Another example is active filters, which exhibit shifts in pass-band as the temperature changes.

The changes in performance with temperature in most circuit elements is due largely to the inherent properties of the materials used to manufacture the circuit elements. Materials used in capacitor dielectrics exhibit decreases in permittivity with increases in temperature. Transistors exhibit lower gain at higher temperatures due to reduced carrier mobility in the semiconductor material from which they are made. As a result, it is not possible to compensate the performance variance with temperature with changes in the design of the circuit elements. Compensation for temperature changes may be possible with changes in the circuit design, or with the addition of circuitry to detect the temperature and compensate for temperature-based changes in material properties. These additions or modifications are not possible in all cases, and, even where possible, may not be desirable due to other factors such as increased cost, reduced reliability, or adverse effects on other aspects of the performance of the circuit.

There is a need for an improved approach to minimizing or avoiding the adverse consequences of the temperature variance of material properties on the performance of electrical devices. The present invention fulfills this need, and further provides related advantages.

SUMMARY OF THE INVENTION

The present invention provides a capacitor, an electrical device using the capacitor, and a method of utilizing the capacitor and electrical device for temperature compensation of the signal of the electrical device. The capacitor can be of conventional design, except for the insulating material of the capacitor. The capacitor can be made as a separate element or as an element of an integrated circuit.

In accordance with the invention, an electrical device comprises an electrical circuit which is not a memory device. The electrical circuit includes at least one circuit element, and, additionally, a positive-temperature-coefficient (PTC) capacitor in electrical communication with the at least one circuit element. The PTC capacitor comprises a first electrical conductor, a second electrical conductor, and a ferroelectric material disposed between and in contact with both the first and second electrical conductors. The at least one circuit element and the PTC capacitor cooperate such that the polarization state of the ferroelectric material does not switch. That is, the ferroelectric material is in a non-switching region of its characteristic of polarization as a function of applied electric field, that is its polarization-applied field (P-E) characteristic. Consequently, the temperature variation of the performance of the electrical circuit is less than would be experienced if a conventional capacitor were used rather than the PTC capacitor. The ferroelectric material is preferably a layered perovskite material of the Aurivillius family below its Curie Temperature, most preferably $SrBi_2Ta_2O_9$.

Further in accordance with the invention, a method of providing a temperature-compensated electrical signal comprises the steps of providing an electrical device having at least one circuit element, and, additionally, a ferroelectric capacitor in electrical communication with the at least one circuit element. The ferroelectric capacitor comprises a first electrical conductor, a second electrical conductor, and a ferroelectric material disposed between and in contact with the first and second electrical conductors. The at least one circuit element and the ferroelectric capacitor do not constitute, in combination, a memory device. The electrical device is operated at a first temperature below a Curie temperature of the ferroelectric material and such that the polarization state of the ferroelectric material does not switch during operation. The temperature is changed to a second temperature below the Curie temperature of the ferroelectric material, and thereafter the electrical device is operated at the second temperature and such that the polarization state of the ferroelectric material does not switch during operation.

The degree of signal compensation achieved by the capacitor as the temperature is changed depends upon the details of the electrical device and also upon the requirements and design of the PTC capacitor. It is not expected that a complete compensation will be achieved in all or most cases. However, it is expected that the use of the PTC capacitor in place of a conventional capacitor will at least reduce the adverse effects of the decrease in capacitance with increasing temperature of the other components of the electrical device.

Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
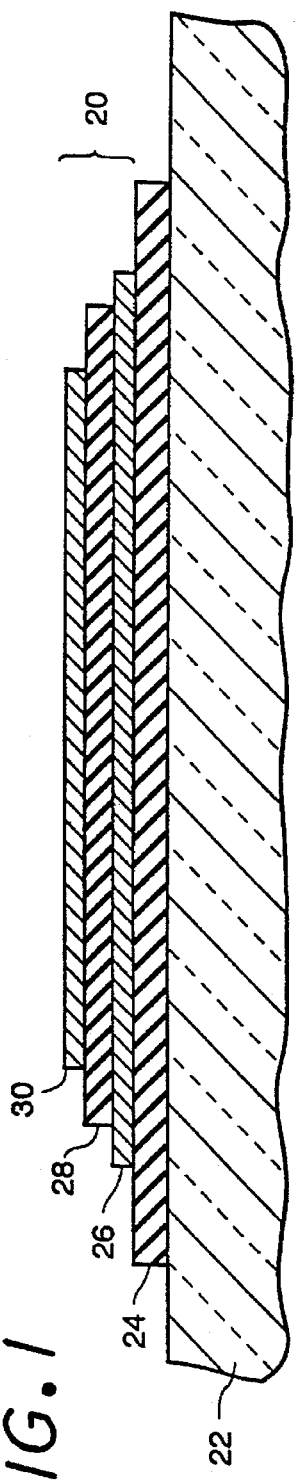
FIG. 1 is a schematic elevational view of a capacitor according to the invention.

Both discrete, individual capacitors and thin-fill capacitors such as produced by microelectronic techniques and integrated into a microelectronic circuit are operable in the present invention. The use of thin-film capacitors is most preferred by the inventors and will be described herein. FIG. 1 depicts such a capacitor 20. The capacitor 20 rests upon a substrate 22 and is fabricated by standard microelectronic techniques such as deposition (and etching, where necessary). The preferred substrate 22 is single-crystal silicon. An isolation layer 24 of an electrical insulator lies between capacitor 20 and the substrate 22. The preferred isolation layer 24 is silicon dioxide ($SiO_2$), most preferably about 4000 Angstroms thick.

The capacitor 20 includes a first electrical conductor 26, in the form of a thin sheet or layer in this embodiment. The first electrical conductor 26 lies in contact with the isolation layer 24 so that the isolation layer 26 is between the first electrical conductor 26 and the substrate 22. The preferred first electrical conductor 26 is platinum, most preferably about 2000 Angstroms thick. A thin sheet or layer of ferroelectric material 28 contacts the first electrical conductor 26, so that the first electrical conductor 26 lies between the ferroelectric material 28 and the isolation layer 24. The ferroelectric layer 28 is a material having a positive temperature coefficient of capacitance, as will be discussed more fully below, and is most preferably about 1800 Angstroms thick. The lateral area and thickness of the ferroelectric layer 28 can be selected to attain a selected capacitance value in the capacitor 20. A second electrical conductor 30, in the form of a thin sheet or layer in this embodiment, lies on and contacts the ferroelectric material 28, so that the ferroelectric material 28 lies between the first electrical conductor 26 and the second electrical conductor 30. External electrical connections to the electrical conductors 26 and 30 are made by conventional techniques such as traces, conductive regions of other layers, or wire-bonded leads.

The ferroelectric material 28 has a positive temperature coefficient of capacitance. Most preferably, the ferroelectric material 28 is an Aurivillius material of the form $A_{m-1}^{+2}S_2^{+3}B_m^{+5}O_{3m+3}^{-2}$, where A is Sr, Ca, Ba, Cd, or Pb, or mixtures thereof; m is 2, 4, or 5; S is Bi, Sc, Y, La, Sb, Cr, or Th, or mixtures thereof; and B is Ti, Ta, Nb, Zr, or Hf, or mixtures thereof. Such materials were described by B. Aurivillius, *Ark. Kem.*, vol. 1, pages 463–499 (1949). The Aurivillius compounds are known ferroelectric materials having a structure comprised of m perovskite-like units of $ABO_3$ between $Bi_2O_3$-like layers along a pseudo-tetragonal c-axis. The crystal symmetry is pseudo-tetragonal (actually orthorhombic) below the Curie temperature and tetragonal above the Curie temperature. The orthorhombic distortion which occurs as the crystal approaches the phase transition at the Curie temperature is thought to be responsible for the positive temperature coefficient of capacitance of the members of this class which is observed below the Curie temperature. See K. C. Subbarao, *J. Phys. Chem. Solids*, vol. 23, pages 665–676 (1962).

Figure 2:
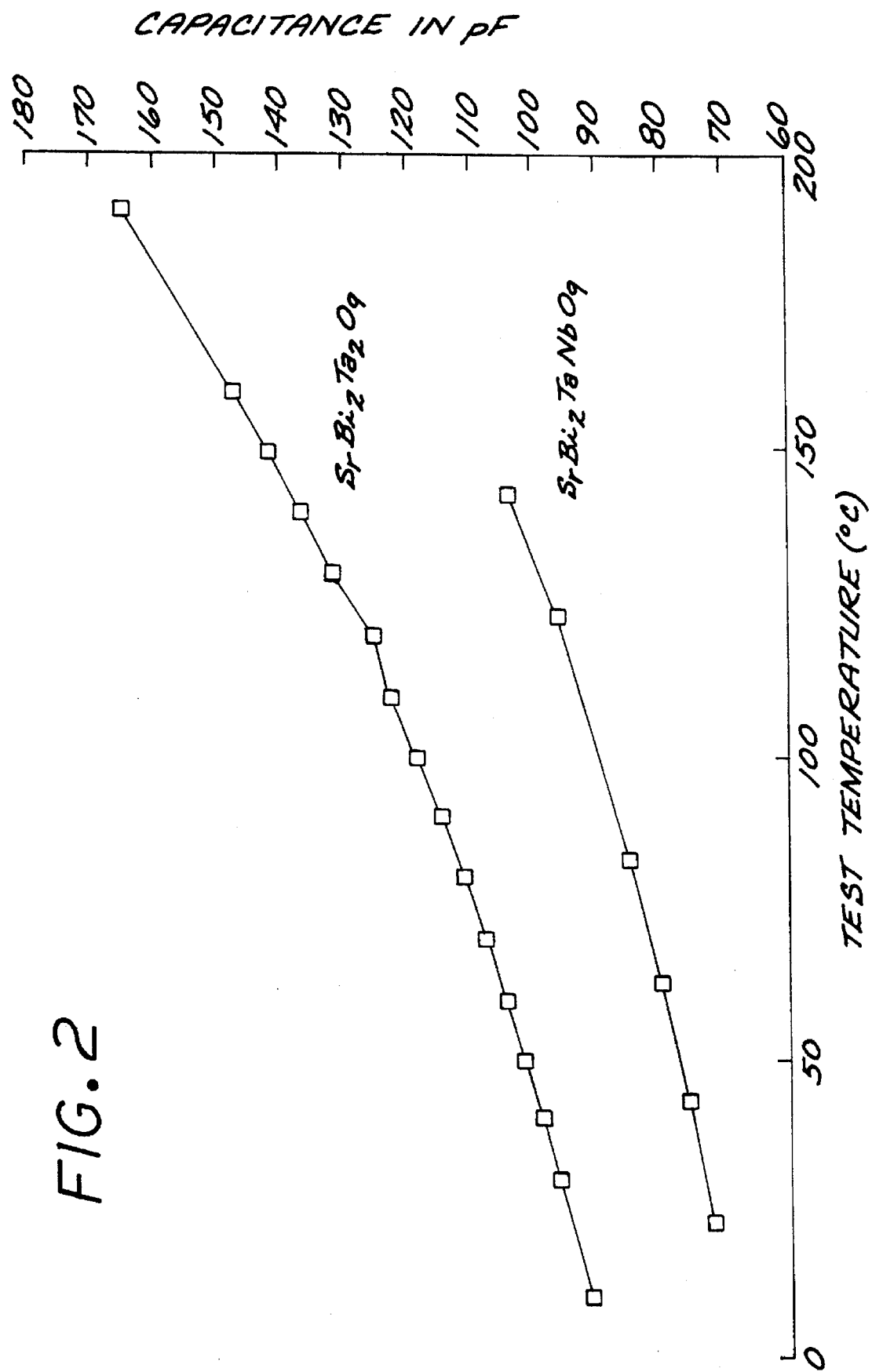
FIG. 2 is a graph of measured capacitance as a function of temperature for two capacitors made according to the invention.
Figure 3:
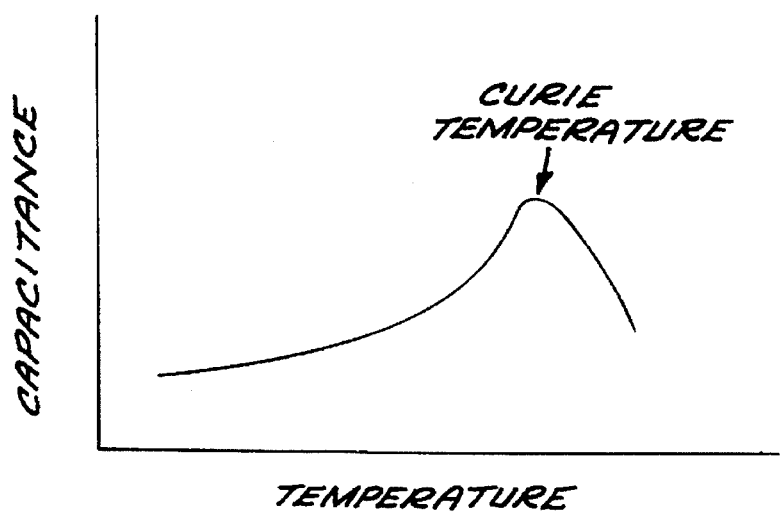
FIG. 3 is a schematic graph of capacitance as a function of temperature relative to the Curie temperature for a ferroelectric material.

The capacitor 20 made using the ferroelectric material 28 exhibits a positive temperature coefficient (PTC) of capacitance, as shown in FIG. 2 for two preferred ferroelectric materials at temperatures below their Curie temperatures. As shown in FIG. 3, the capacitance of these materials increases with temperature up to the Curie temperature, but decreases at higher temperatures. The operation of the devices to achieve the benefits of the invention is limited to the range having a positive temperature coefficient of capacitance, in the illustrated cases temperatures below the Curie temperature. In one capacitor of interest to the inventors whose performance is illustrated in FIG. 2, the ferroelectric material 28 was $SrBi_2Ta_2O_9$ with a thickness of 1800 Angstroms and an area of about $10^{-4}$ $cm^2$. In the other capacitor, the ferroelectric material 28 was $SrBi_2TaNbO_9$ with a thickness of 2100 Angstroms and an area of about $10^{-4}$ $cm^2$. In both cases, the curve of capacitance as a function of temperature has a positive slope, indicative of a positive temperature coefficient of capacitance.

The selection of the Aurivillius material to be used depends upon the application. The primary selection criterion is that the selected material must have the necessary capacitance in the selected size of capacitor. Secondly, the selected material should have the desired positive temperature coefficient of capacitance. The temperature coefficient of capacitance is dependent upon the temperature of use relative to the Curie temperature. Thus, a desired temperature coefficient of capacitance can be obtained by selecting the ferroelectric material for the capacitor according to its Curie temperature. The closer the planned operating temperature range is to the Curie temperature, the higher will be the temperature coefficient of capacitance. Thirdly, the performance of the device may be affected by the presence and size of a hysteresis loop in the capacitance. For some applications, a large hysteresis loop may not be of concern, while in other applications it may be necessary to have a small or zero hysteresis loop in the graph of capacitance as a function of charge. Tantalate and niobate Aurivillius compounds tend to exhibit a larger hysteresis loop, while titanate Aurivillius compounds tend to exhibit a smaller hysteresis loop. The effect of any material hysteresis loop can be minimized, if desired, in an electrical device by biasing the ferroelectric capacitor to a range apart from that in which the hysteresis loop is observed.

The Aurivillius compounds whose capacitances as a function of temperature are shown in FIG. 2 are the most preferred materials for use as the ferroelectric materials.

Figure 4:
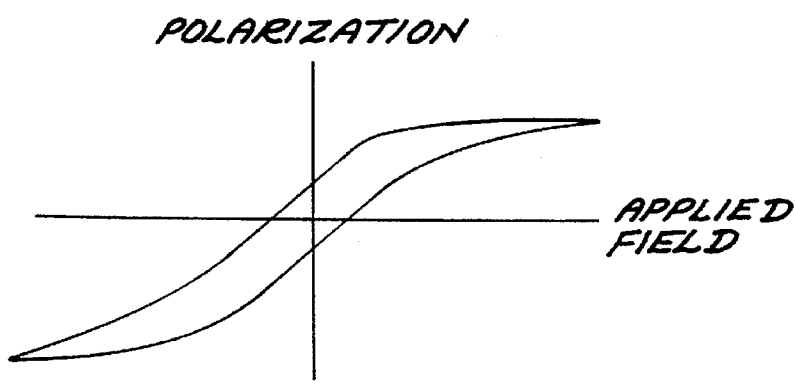
FIG. 4 is a schematic graph of capacitance as a function of applied field for a ferroelectric capacitor.

The PTC capacitor 20 can be used in a wide range of electrical devices other than ferroelectric memory cells or other applications where the polarization sate of the PTC capacitor 20 does not switch during use of the electrical device. This condition may be equivalently sated that the PTC capacitor is in a non-switching region of its characteristic of polarization as a function of applied electric field, that is its P-E (polarization-applied field) characteristic during the operation of the electric device, as schematically illustrated in FIG. 4. Conventional capacitors and many other circuit components exhibit a degradation in performance with increasing temperature Consequently, as the temperature of operation of the device changes, the circuit performance changes such that in some instances there are adverse consequences on the signals produced by the electrical device. Utilization of the PTC capacitor 20 in some or all of the capacitors of the electrical device can offset this effect, either entirely or in part. In a typical case, it is not possible to offset the loss of performance entirely, but a partial offset is still beneficial.

The positive temperature coefficient of capacitance of such ferroelectric capacitors has not been previously recognized as of value in achieving temperature compensation in electrical circuits wherein the capacitor is used in its conventional role in which the polarization state of the capacitor is not switched during use of the circuit. On the other hand, the use of ferroelectric capacitors has been known in memory cells, wherein the polarization state is switched during use of the circuit and the charge stored in the capacitor is measured as an indication of the information stored in the memory cell. See, for example, published PCT application WO/93/12542, at pages 17–18 and FIGS. 3A–D. In this memory application, the positive temperature coefficient of capacitance of the ferroelectric capacitor does not result in any advantage, and in fact tends to degrade the operation of the memory cell by increasing the reference capacitance and decreasing the signal capacitance.

Figure 5:
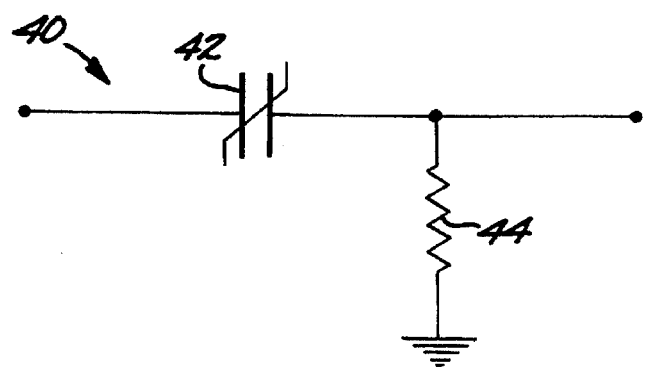
FIG. 5 is a schematic diagram of a preferred electrical device using a capacitor of the invention.

FIG. 5 depicts a high pass filter circuit 40 utilizing the approach of the invention, as an example of a circuit in which the PTC capacitor may be used beneficially. The circuit 40 includes a ferroelectric PTC capacitor 42 having one side connected to a resistor 44 whose other side is grounded. The −3 dB point of this high pass filter circuit 40 is achieved at $1/2\pi RC$, where R is the resistance of the resistor 44 and C is the capacitance of the capacitor 42. As the temperature of use of the circuit 40 increases, the resistance of the resistor 44 falls and is compensated by the increase in the capacitance of the ferroelectric PTC capacitor 42.

Figure 6:
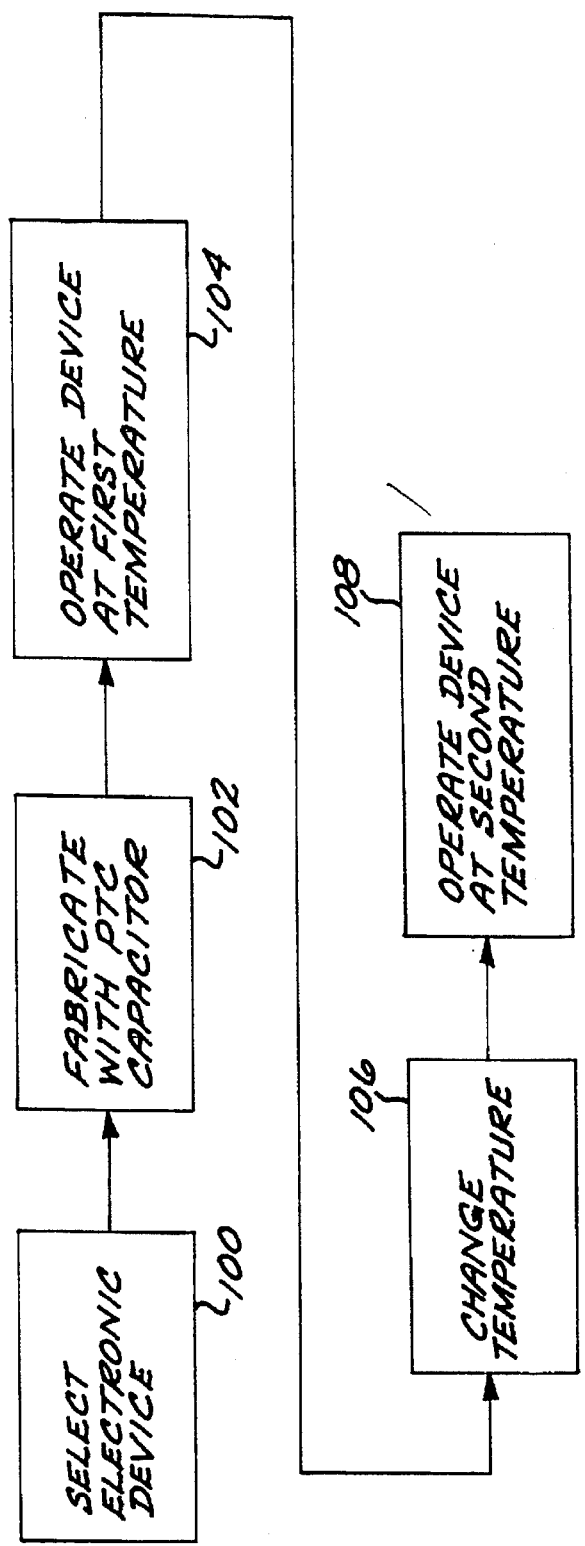
FIG. 6 is a block diagram of a method for providing a temperature-compensated electrical signal.

FIG. 6 is a block diagram for practicing the preferred approach of the invention to achieve temperature compensation of an electrical device. A design of an otherwise known type of electrical circuit, such as in a device of the type shown in FIG. 5, is selected having at least one capacitor therein, numeral 100. The design is fabricated so as to include at least one PTC capacitor of the type discussed herein, as shown in FIG. 1, numeral 102. The device is thereafter operated at a first temperature, numeral 104, the temperature is changed, numeral 106, and the device is operated at a second temperature, numeral 108. When the device is operated at these two temperatures, both of which are below the Curie temperature of the ferroelectric material, the change in performance is less than if a conventional capacitor were used.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An electrical device comprising
at least one circuit element; and, additionally,
a ferroelectric capacitor in electrical communication with the at least one circuit element, the capacitor comprising:
a first electrical conductor,
a second electrical conductor, and
$SrBi_2Ta_2O_9$ ferroelectric material disposed between and in contact with the first and second electrical conductors,
wherein the at least one circuit element and the ferroelectric capacitor do not constitute, in combination, a memory device.

2. An electrical device comprising an electrical circuit which is not a memory device, the electrical circuit including
at least one circuit element; and, additionally,
a positive-temperature-coefficient capacitor in electrical communication with the at least one circuit element, the capacitor comprising:
a first electrical conductor,
a second electrical conductor, and
a ferroelectric material disposed between and in contact with the first and second electrical conductors,
the at least one circuit element and the positive-temperature-coefficient capacitor cooperating such that the ferroelectric material is in a non-switching region of its characteristic of polarization as a function of applied electric field at a temperature below the Curie temperature of the ferroelectric material.

3. The electrical device of claim 2, wherein the electrical circuit comprises at least two interconnected circuit elements.

4. The electrical device of claim 2, wherein the ferroelectric material is a layered perovskite material of the Aurivillius family.

5. The electrical device of claim 2, wherein the dielectric material is selected from the group consisting of a tantalate, a niobate, a titanate, and a zirconate.

6. The electrical device of claim 2, wherein the ferroelectric material is $SrBi_2Ta_2O_9$.

7. The electrical device of claim 2, wherein the first electrical conductor, the second electrical conductor, and the dielectric material are thin films.

8. A method of providing a temperature-compensated electrical signal, comprising the steps of:
providing an electrical device having at least one circuit element, and, additionally, a ferroelectric capacitor in electrical communication with the at least one circuit element, the ferroelectric capacitor comprising:
a first electrical conductor,
a second electrical conductor, and
a ferroelectric material disposed between and in contact with the first and second electrical conductors,
wherein the at least one circuit element and the ferroelectric capacitor do not constitute, in combination, a memory device;
operating the electrical device at a first temperature below a Curie temperature of the ferroelectric material and such that the ferroelectric material is in a non-switching region of its polarization as a function of applied electric field characteristic;
changing the temperature to a second temperature below the Curie temperature of the ferroelectric material; and thereafter
operating the electrical device at the second temperature and such that the ferroelectric material is in a non-switching region of its polarization as a function of applied electric field characteristic.

9. The method of claim 8, wherein the step of providing includes the step of
providing the ferroelectric capacitor wherein the ferroelectric material is a layered perovskite material of the Aurivillius family.

10. The method of claim 8, wherein the step of providing includes the step of
providing the ferroelectric capacitor wherein the ferroelectric material is selected from the group consisting of a tantalate, a niobate, a titanate, and a zirconate.

11. The method of claim 8, wherein the step of providing includes the step of
providing the ferroelectric capacitor wherein the ferroelectric material is $SrBi_2Ta_2O_9$.

12. The method of claim 8, wherein the step of providing includes the step of
providing the ferroelectric capacitor wherein the first electrical conductor, the second electrical conductor, and the ferroelectric material are thin films.

13. The method of claim 8, wherein the step of providing includes the steps of:
selecting an electrical device design having at least one capacitor therein; and
fabricating the electrical device design with at least one capacitor comprising the first electrical conductor, the second electrical conductor, and the ferroelectric material disposed between and in contact with the first and second electrical conductors.

14. An electrical device comprising an electrical circuit which is not a memory device, the electrical circuit including at least one circuit element; and, additionally, means for achieving temperature compensation of the performance of the electrical circuit in an operating temperature range, the means for achieving comprising a positive-temperature-coefficient capacitor in electrical communication with the at least one circuit element, the capacitor comprising:

a first electrical conductor, a second electrical conductor, and a ferroelectric material disposed between and in contact with the first and second electrical conductors, the ferroelectric material having a Curie temperature greater than the operating temperature range, the at least one circuit element and the positive-temperature-coefficient capacitor cooperating such that the polarization state of the ferroelectric material does not change in the operating temperature range.

* * * * *